(12) United States Patent
Martin

(10) Patent No.: US 12,119,837 B2
(45) Date of Patent: Oct. 15, 2024

(54) METHOD FOR MONITORING AN ENGINE CONTROL UNIT

(71) Applicant: SAFRAN AIRCRAFT ENGINES, Paris (FR)

(72) Inventor: Christophe Pierre Georges Martin, Moissy-Cramayel (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 352 days.

(21) Appl. No.: 17/607,259

(22) PCT Filed: Apr. 30, 2020

(86) PCT No.: PCT/FR2020/050732
§ 371 (c)(1),
(2) Date: May 3, 2022

(87) PCT Pub. No.: WO2020/225507
PCT Pub. Date: Nov. 12, 2020

(65) Prior Publication Data
US 2023/0036687 A1    Feb. 2, 2023

(30) Foreign Application Priority Data

May 3, 2019  (FR) ...................... 1904675

(51) Int. Cl.
*H03M 1/10* (2006.01)
*G06F 11/16* (2006.01)

(52) U.S. Cl.
CPC ......... *H03M 1/1076* (2013.01); *G06F 11/165* (2013.01)

(58) Field of Classification Search
None
See application file for complete search history.

(56) References Cited

U.S. PATENT DOCUMENTS 5,001,641 A  3/1991 Makino
5,144,230 A  9/1992 Katoozi et al.
(Continued)

FOREIGN PATENT DOCUMENTS

FR  2989488 A1  10/2013
JP  2006011576 A  1/2006
(Continued)

OTHER PUBLICATIONS

Translation of FR 2989488 A1 (Year: 2013).*
(Continued)

*Primary Examiner* — Jermele M Hollington
(74) *Attorney, Agent, or Firm* — Christensen O'Connor Johnson Kindness PLLC

(57) ABSTRACT

Methods are provided for supervising a motor control unit with at least two separate channels, each of the two channels including at least: means for executing a given application task AS, the application task AS including a plurality of successively executed computations between which latency periods elapse; a first component capable of performing the computations; a second component capable of storing data; the application tasks AS of the channels being capable of communicating. The method includes the following steps: a) detecting a latency period; b) performing, during this latency period, an operating state test of at least one of the components; and c) determining a state of the component corresponding to a failure state or a healthy state.

10 Claims, 4 Drawing Sheets

(56) References Cited

U.S. PATENT DOCUMENTS

| | | | |
|---|---|---|---|
| 6,615,366 B1 | 9/2003 | Grochowski et al. | |
| 7,865,770 B2* | 1/2011 | Quach | G06F 9/30189 714/45 |
| 8,566,633 B2* | 10/2013 | Fuhrman | G05B 19/0428 714/4.11 |
| 8,799,713 B2* | 8/2014 | Gangasani | G06F 11/27 714/30 |
| 9,995,235 B2 | 6/2018 | Kettenacker et al. | |
| 2006/0100772 A1 | 5/2006 | Rauner et al. | |
| 2008/0140280 A1 | 6/2008 | Kerejewski et al. | |
| 2008/0234919 A1* | 9/2008 | Ritter | G01M 15/10 701/102 |
| 2011/0138230 A1 | 6/2011 | Nakatani et al. | |
| 2012/0085101 A1* | 4/2012 | Godel | F01D 21/02 60/779 |
| 2012/0226942 A1 | 9/2012 | Gangasani et al. | |
| 2017/0242693 A1* | 8/2017 | Izaki | G06F 9/226 |

FOREIGN PATENT DOCUMENTS

| | | |
|---|---|---|
| JP | 2011123545 A | 6/2011 |
| RU | 1784743 A1 | 12/1992 |
| RU | 2486366 C2 | 6/2013 |

OTHER PUBLICATIONS

Grosso M. et al., "Exploiting embedded FPGA in on-line software-based test strategies for microprocessor cores", On-Line Testing Symposium, 2009. IOLTS 2009. 15th IEEE International, IEEE, Piscataway, NJ, USA, (Jun. 24, 2009), ISBN 978-1-4244-4596-7, pp. 95-100.

International Search Report mailed on Aug. 13, 2020, issued in corresponding International Patent Application No. PCT/FR2020/050732, filed on Apr. 30, 2020, and its English translation thereof, 7 pages.

Written Opinion of the International Searching Authority mailed on Nov. 12, 2020, issued in corresponding International Patent Application No. PCT/FR2020/050732, filed on Apr. 30, 2020, and its English translation thereof, 12 pages.

Written Opinion of the International Searching Authority mailed Aug. 13, 2020, issued in corresponding International Patent Application No. PCT/FR2020/050732, filed Apr. 30, 2020, 7 pages.

International Preliminary Report on Patentability mailed Nov. 2, 2021, issued in corresponding International Patent Application No. PCT/FR2020/050732, filed Apr. 30, 2020, 1 page.

Ugryumov, E.P., Digital Circuitry, St. Petersburg, BHV-Petersburg, 2007, 7 pages (title page, introduction pages, and pp. 233, 245, 520, 535, 758).

Search Report dated Apr. 14, 2023, issued in corresponding Russian Patent Application No. 2021135448, filed Apr. 30, 2020, 2 pages.

Office Action mailed Apr. 19, 2023, issued in corresponding Russian Patent Application No. 2021135448, filed Apr. 30, 2020, 11 pages.

Office Action mailed Nov. 7, 2023, issued in corresponding Japanese Patent Application No. 2021-564979, filed Nov. 2, 2011, 6 pages.

* cited by examiner

METHOD FOR MONITORING AN ENGINE CONTROL UNIT

CROSS-REFERENCE TO RELATED APPLICATIONS

This application is a National Stage of International Application No. PCT/FR2020/050732, filed Apr. 30, 2020, which claims priority to French Patent Application No. 1904675, filed May 3, 2019, the entire disclosures of which are hereby incorporated by reference.

TECHNICAL FIELD OF THE INVENTION

The invention relates to turbomachinery, such as an aircraft turbojet or turboprop engine, and more particularly to the control units of such turbomachinery.

PRIOR ART

The operation of aircraft turbomachinery is controlled by means of control units, which are able to pilot and regulate the turbomachinery during the various phases of the aircraft's flight. These control units comprise on-board electronic calculators, which communicate with each other and carry out calculations in parallel, based on the same input data from sensors, for example, in order to establish the commands for the various parts of the turbomachine. During a calculation cycle of a calculator, three tasks are performed. The first task, called the OS task, consists of launching the operating system, i.e., the set of programs that manage the use of resources by application tasks. A second task, known as the applicative system (AS), consists of carrying out the calculations required to determine the commands for controlling and regulating the turbomachinery. The execution time of the AS task represents 80% to 90% of the time needed for a calculation cycle. A third task closes the calculation cycle. This is an OS task identical to the first task.

These calculators, which include many components, perform self-tests to check that none of their components have a major malfunction. These self-tests are performed during OS tasks, i.e., at the beginning and end of the calculation cycles. FIG. 1 illustrates the sequencing of tasks and self-tests, as known in the prior art. A single self-test 26 is initiated at the OS task at the start of the calculation cycle 24.

Nevertheless, component malfunctions can occur in calculator components during application tasks. Such malfunctions can thus lead to disturbances in the motor control unit. It is possible by post-processing analysis, from the disturbances, to trace the faulty component and therefore the faulty calculator. This allows the faulty calculator to be isolated.

It is necessary that this isolation is carried out as soon as possible, in order to reduce the impact of the malfunction on the control and regulation of the turbomachinery. The purpose of the invention is in particular to provide a simple, effective and economical solution to the problems of the prior art described above.

SUMMARY OF THE INVENTION

To this end, a method is proposed for supervising an engine control unit with at least two separate channels, each comprising a calculator, each of said two channels comprising at least:

means for executing a given application task, the application task consisting in part of a plurality of successively executed computations between which latency periods elapse;

a first component adapted to perform the computations of said application task, based on input data;

a second component adapted to store data;

the application task executed by the first channel and the application task executed by the second channel being adapted to communicate with each other, the method comprising the following steps during a current execution cycle j of the application task in each channel:

a) Detecting a latency period;
b) Performing, during this latency period, an operational state test of at least one of the first and second components;
c) Determining a state of said component corresponding to a failure state or a healthy state.

Such a method thus allows each calculator to perform self-tests during application tasks, in particular during latency periods, so as to be able to determine, without waiting for the end of a calculation cycle, the status of the various components included in the calculator. Thus, thanks to such a method, it is possible to detect a faulty calculator without waiting for the end of a calculation cycle, and to isolate it properly at the end of the cycle.

This also allows for diagnostic maintenance by increasing the number of self-tests, to facilitate subsequent ground maintenance operations.

The given application task can be the application task executed by the first channel and the application task executed by the second channel. Thus, the first and second channels can execute the same given application task.

Alternatively, steps a) to c) can be carried out on completion of the following step:

Detecting a symptom resulting from a failure of at least one of the components of the two channels.

Thus, the supervision method allows for component self-tests to be triggered as soon as a symptom resulting from a component failure is detected. In this way, self-tests are triggered as required, on the occurrence of previously identified symptoms resulting from component failures in the calculators of the engine control unit.

The invention thus makes it possible to link component failures to events and/or undesired behaviour of a motor control unit. This makes it possible to obtain a correspondence table linking symptoms to failures of the on-board electronic equipment, in other words the components.

During each cycle, the symptoms detected (and the resulting failures) are recorded in a non-volatile memory, together with various environmental information, for example thermal and/or vibratory, to facilitate maintenance operations.

In addition, the symptom may be a difference in signature between the two channels and/or a loss of communication between the two calculators.

The aim is to identify the symptoms of a failure affecting the calculators. These symptoms may be related to a difference in signature between the two channels executing the same application task, i.e., a difference between the results of calculations carried out by each of the calculators of the first channel and the second channel at the end of the application task, or they may be related to non-arrived data preventing the execution of calculations of the application task on at least one of the channels.

The two channels can each be made up of a calculator

Furthermore, if the detected symptom is a signature difference between the two channels, then the detection can be performed in an execution cycle j-1 that precedes a current execution cycle j. The execution cycle j-1 is called the "previous execution cycle" or "previous cycle".

The signature difference may consist of comparing, at the end of cycle j and in parallel on the two channels, the sum of the calculations of the application task that are performed during the current execution cycle j.

If the detected symptom is a loss of communication between the calculators, then the detection can be performed during the current execution cycle j.

According to another feature, instructions for the execution of the test of step b) can be sent by the application task.

Thus, the application task initiates the functional status tests at the right frequency and during latency periods so that the functional status of the components can be established regularly, without impacting the calculations of the application task.

In a further feature, the first component may be a reprogrammable integrated circuit or FPGA.

In addition, the second component can be a dynamic RAM.

DETAILED DESCRIPTION OF THE INVENTION

Figure 1:
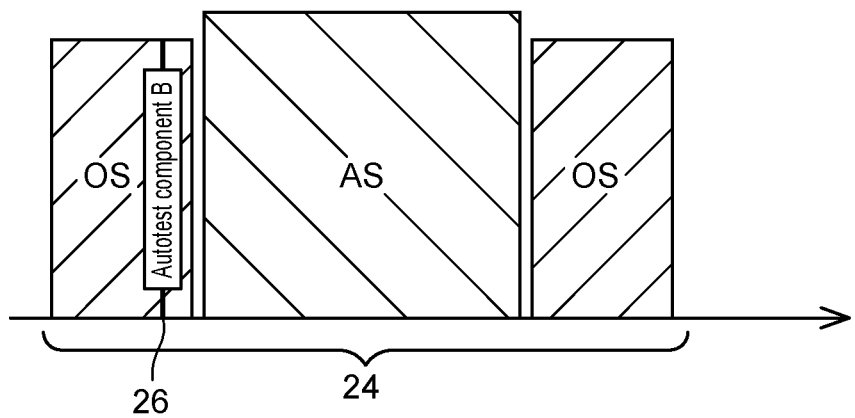
FIG. 1 shows the sequencing of tasks and state tests in a computational cycle according to the prior art.
Figure 2:
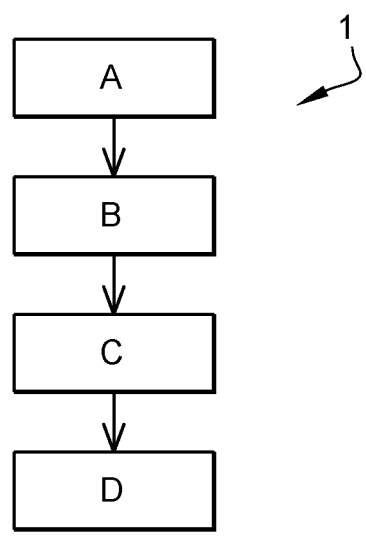
FIG. 2 represents a simplified flowchart of the method for the invention.
Figure 3:
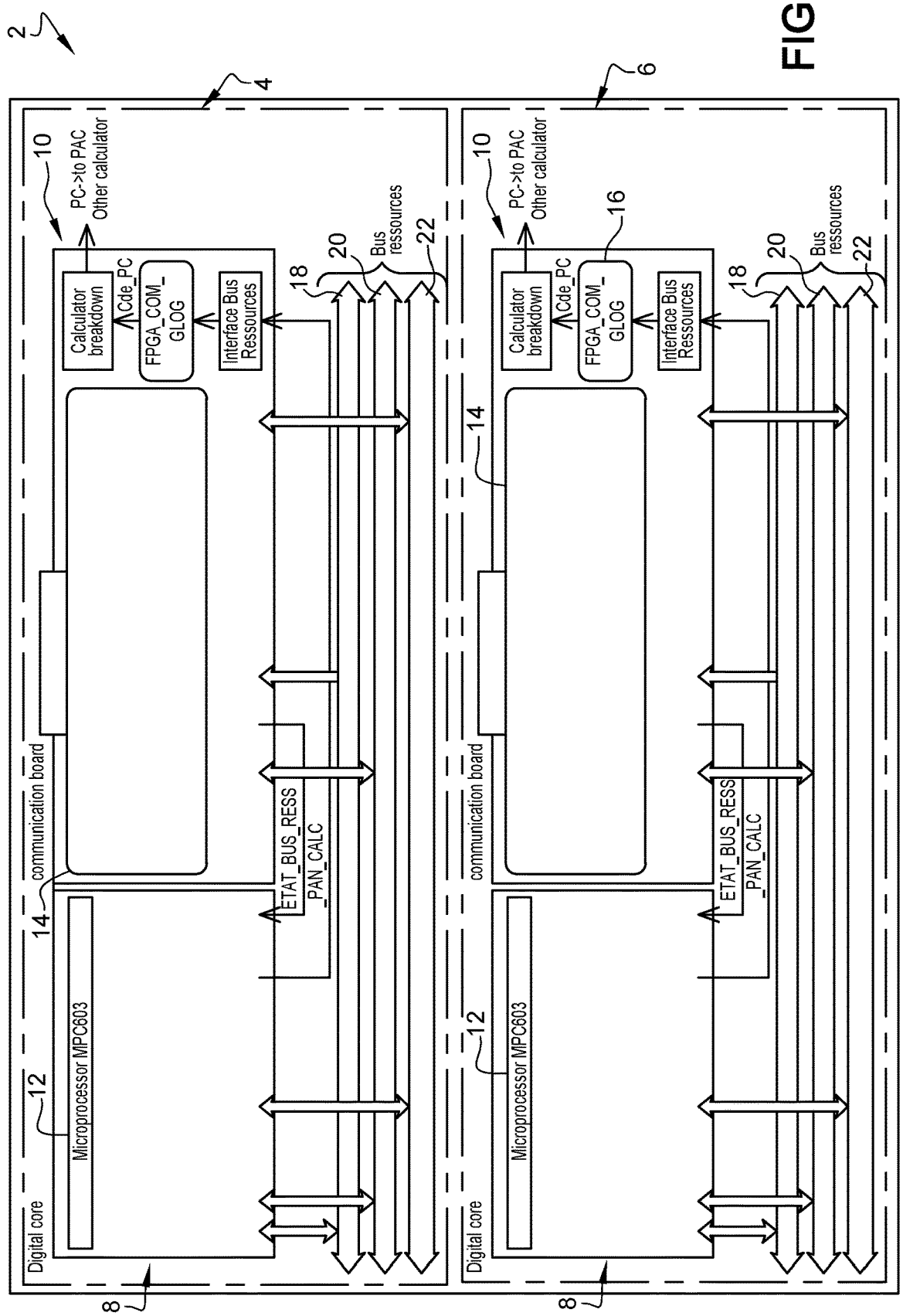
FIG. 3 shows a hardware architecture of an example of a motor control unit with two separate channels.

The supervision method 1, whose flowchart is illustrated in FIG. 2, aims to supervise a motor control unit 2 with at least two separate channels 4, 6, an example of whose architecture is illustrated in FIG. 3.

A two-channel motor control unit 2, 4, 6, thus comprises, as can be seen in FIG. 3, two channels 4, 6, i.e., two calculators. This redundancy of the calculators 4, 6 ensures resistance to a possible failure of one of the calculators 4, 6. Although the two calculators 4, 6 perform the same calculations in parallel from the same input data (i.e., perform the same application task), only one of the calculators 4 controls and regulates the turbomachine by calculating the commands. Thus, the redundant calculator 6, which is also referred to as passive, does not send any commands to the constituent parts of the turbomachine.

The calculators 4, 6 of the illustrated engine control unit 2 have the same architecture.

Firstly, each calculator 4, 6 comprises means for performing a given application task. These means are distributed in the digital core 8 of the calculator and the communication board 10.

The digital core 8 comprises, among other things, a microprocessor 12. The communication board 10, involved in inter-calculator communication, comprises a first and a second component 14, 16. The first component 14, capable of performing the calculations of said application task from input data is in this example an FPGA, but can also be a reprogrammable integrated circuit. The second component 16, capable of storing data, is a memory, preferably a dynamic RAM.

The first component 14, in the example an FPGA (Field-Programmable Gate Array) enables the exchanges between the two calculators 4, 6 to be clocked. The second component 16, preferably a DPRAM (Dual Ported Random Access Memory), receives signals from the first component 14 and stores data such as input data from sensors as well as intermediate results of calculations.

The application task AS, consisting in part of a plurality of successively executed calculations between which latency periods elapse, makes it possible in particular to calculate, from input data coming from sensors for example, the control currents intended for actuators of moving elements constituting the turbomachine. Such actuators include, for example, electrohydraulic servo valves in combination with cylinders or other devices. The application task AS is thus executed simultaneously in parallel on each of the calculators 4, 6 of the engine control unit 2. The AS application task running on the first channel 4 and the AS application task running on the second channel 6 are able to communicate with each other via a first 18, second 20 and third 22 bus. The first bus 18 is used to exchange addresses of data memories to be retrieved. The second bus 20 is used to exchange data, such as sensor input data. This may include, for example, measurements such as the acquisition of engine temperature values. The results of the intermediate and final calculations pass through the second bus 20, from the digital core 8, performing the calculations, to the communication board 10, transmitting the calculated currents for example. The third bus is used to exchange the commands calculated from the input data. This is a so-called control bus for controlling the read and write authorisations on the first bus 18 and the second bus 20 for each of the calculators 4, 6. This control bus thus enables the sequencing of exchanges and the management of priorities for read, write and exchange operations.

Figure 4:
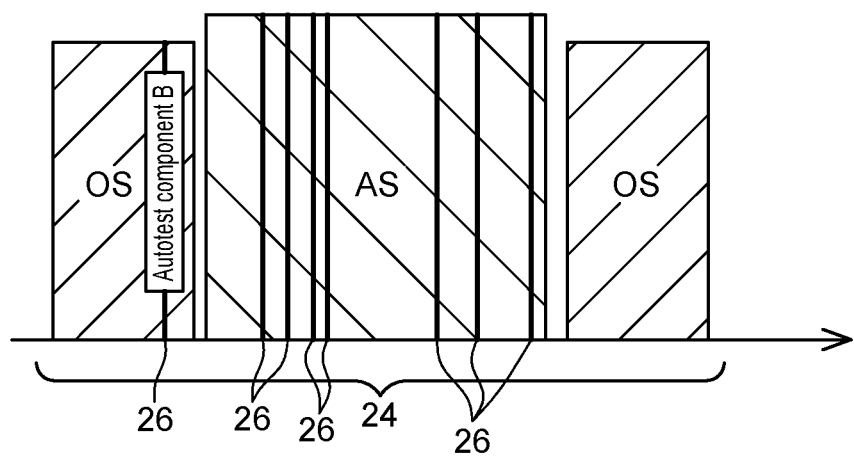
FIG. 4 illustrates the sequencing of tasks and state tests during a calculation cycle according to the method of the invention.

The supervision method 1 is executed in each execution cycle 24 on each of the channels, as illustrated in FIG. 4.

The first step A of the method 1 is to detect a symptom resulting from a failure of at least one of the components 14, 16 of the two channels 4, 6.

The symptoms of a component failure 14, 16 on one of the two channels 4, 6 are as follows:

Data not arrived: the AS application task waiting for an input data item (from a previous calculation or from a sensor) does not receive the data item to carry out further calculations.

Erroneous data: the AS application task waiting for an input data item (from a previous calculation or from a sensor) receives an erroneous data item to carry out further calculations, resulting in erroneous calculations.

Data stored at the wrong address: When a data item is received, it is stored at an address in the second component 16, a dynamic RAM.

When the address at which the data item is stored is wrong, there can be two consequences:

data item not arrived: at the address where the data item was to be stored, there is no usable data item for the calculations of the AS application task.

erroneous data item: at the address where the data item was to be stored, a data item previously stored there is used for further calculations by the AS application task.

These symptoms can have two consequences. The first consequence is that the observed failure corresponds to a signature difference on the two channels 4, 6, i.e., for a given AS application task, the calculations performed on each of the calculators 4, 6 lead to different results. The second consequence is that the observed failure consists of a disruption of the inter-calculator communication (the exchanged data is erroneous or missing).

Thus, the detection of these symptoms indicates the failure of at least one component 14, 16 of at least one of the calculators 4, 6.

The second step B of the method then consists of detecting a latency period of the application task AS. Indeed, as the AS application task consists of a plurality of calculations from several input data items, there are latency periods between calculations during which the AS application task is waiting for data to perform the next calculation. During these latency periods, the resources of channels 4, 6, i.e., the first 4 and second 6 components, are not used. These latency periods can thus be exploited to perform operational status tests to determine which of the first 14 and second 16 components of the first 4 and second 6 calculator is failing and causing the identified symptom(s).

The third step C of the method 1 then consists of executing, during this latency period, an operating state test of at least one of the first 14 and second 16 components. This functional status test is preferably carried out on each of the components 14, 16 in parallel on the two channels 4, 6, i.e., for the two calculators. The sequencing of the operational status tests can be seen in FIG. 4. Thus, several functional tests are triggered during the latencies of the application task, in addition to the one triggered at the beginning of the cycle during the OS task.

Self-tests are so-called March tests. Self-tests are used to test the read and write capacity of each component. To do this, a message of type AAAA and then 5555 in hexadecimal is written successively to addresses of type 5555 and then AAAA in hexadecimal. Writing content to these two addresses automatically triggers the read tests.

These self-tests are carried out during latency times (i.e., free time) and almost simultaneously with each exchange on the bus.

Thus, the application task AS sends instructions to each of the components 14, 16, respectively, to perform an operational status test 26. In other words, the operational state tests 26 are called by the AS application task so that they are executed during latency times. Thus, the tests performed do not impact the calculation time of the AS application task.

The fourth step D of the method 1 is to determine a status of the component(s) 14, 16 for which an operational status test 26 has been performed. The state can be either a failed state or a healthy state. Thus, if, during the same cycle or two consecutive cycles, a symptom is observed and a faulty condition of one of the components 14, 16 is found, then a correlation between the detected symptom(s) and the found component(s) fault(s) is made.

In order to limit the impact of the identified failed component, the calculator containing the failed component is isolated. In other words, following a functional status test or self-test 26, which is initiated by the AS application task, the calculator with a detected and proven failure no longer executes the AS application task in subsequent cycles and therefore no longer communicates with the calculator considered to be healthy. The engine control unit 2 then becomes single-channel, with the application task AS being executed on only one calculator considered healthy.

Following this isolation, to avoid IFSD (In Flight Shutdown) when one of the two channels 4, 6 is isolated, the launch of the self-tests 26 by the application task AS is suspended. Thus, no self-test 26 is performed on the remaining calculator, apart from the self-tests 26 performed by the OS task at the beginning and end of the cycle.

Figure 5:
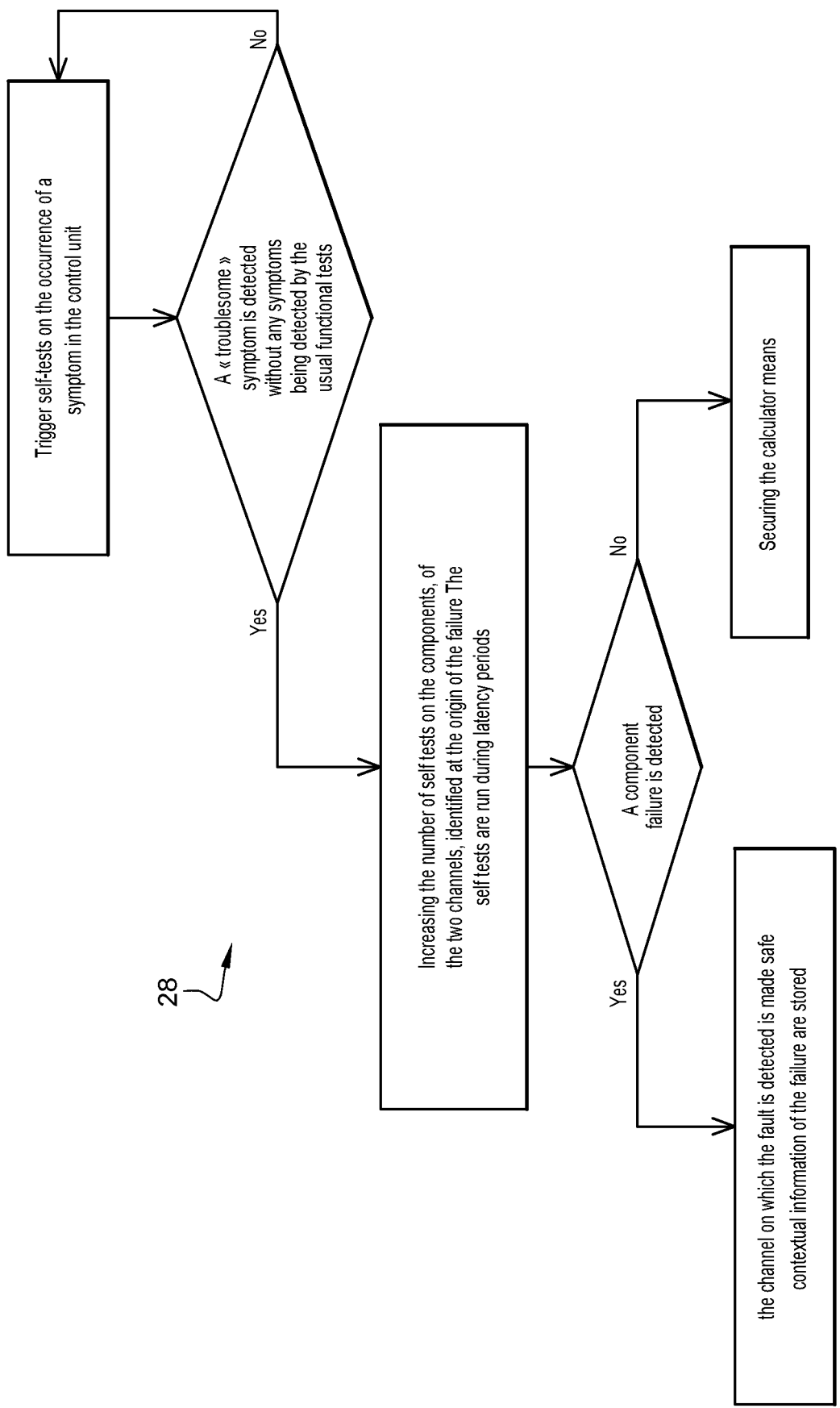
FIG. 5 illustrates a flow chart of an embodiment of the method for the invention.

FIG. 5 illustrates, by means of a flow chart, another example of the method 28 for the invention. The overall strategy of the system is to trigger self-tests 26 on the occurrence of a symptom in the control unit 2. The first step is to detect, as detailed above, a next failure symptom in cycle j. Symptoms may include the following:

Data item not arrived: when the AS application task is actively waiting for a data item during a latency period, a data item not arrived is detected as soon as the time the application task waits for the data item exceeds a maximum waiting time. The maximum waiting time is at least 3 ms.

Signature difference between the first channel 4 and the second channel 6: at the end of the AS application task, the sum of the results of the calculations performed by the AS application task on the two channels 4, 6 is compared. This verifies that the two channels 4, 6 perform the same calculations. If the sum is different on the two channels 4, 6, this means that at least one of the two channels 4, 6 is using the wrong calculation input. Since the sum is performed at the end of the application task AS, i.e., a cycle, the detection of this symptom is performed in the previous cycle j-1, so that the self-tests 26 are launched in cycle j. In other words, the signature difference consists of comparing, at the end of the previous cycle j-1 and in parallel on the two channels 4, 6, the sum of the calculations of the application task AS performed during the previous cycle j-1. In the case of a signature deviation detection in the previous cycle j-1, the steps B to D of process 1 (of the flowchart in FIG. 2) are performed in the current cycle j.

When one of the above symptoms is identified, the application task AS increases the number of self-tests 26 run during latency periods to identify component failures that may be causing the symptom. The self-tests 26 are thus started until the end of the current execution cycle j.

Thus, by increasing the number of self-tests and distributing them over the latency periods of the calculation cycle, the coverage of the self-tests is consequently increased.

The possible failures of the first component 14, the FPGA, are as follows:

Microcracking of one of the solder joints of one of the 16 branches of component 14: some microcracks may be non-impacting, except when the microcracking impacts the solder joint of a corresponding low-order bit branch;

Data not updated;

Failures during read and/or write access to the memory.

The possible failures of the second component 16, the DPRAM, are as follows:

Storage of a data item at the wrong address in the memory;

Non-storage of a data item;

Internal memory failure which can be of the following three types: short circuit, coupling fault and sticking fault.

As soon as a failure is identified by means of the self-tests 26, the track on which the fault is detected is made safe, i.e., the channel is isolated. Also, the failure, as well as contextual information about the status of the control unit such as temperature, vibration status, engine speeds, aircraft attitudes, engine health, flight number and date of failure, are stored in non-volatile memory to facilitate maintenance operations.

In the event that no component failure is identified, a trip is provided by the supervision process 28. Securing a calculator means ensuring that:
- the OS task no longer calls the AS application task,
- the control currents are no longer calculated and therefore no longer issued by this calculator. Redundancy is then lost.

The invention claimed is:

1. A method for supervising an engine control unit of a turbomachine with at least a first channel and a second channel, each of the first channel and the second channel comprising a calculator and: means for performing an application task, the application task comprising a plurality of successively executed calculations between which latency periods elapse; a first component for carrying out the successively executed calculations of said application task, from input data; a second component adapted to store data; the application task executed by the first channel and the application task executed by the second channel communicating with each other, the method comprising the following steps during a current execution cycle of the application task for each of the first channel and the second channel:
   a) detecting a latency period during which the application task is waiting for data to perform calculations;
   b) performing, during the latency period, an operational state test of at least one of the first or second components; and
   c) determining a state of said at least one of the first component or the second component, wherein the state corresponds to a failure state or a healthy state.

2. The method according to claim 1, further comprising: detecting a symptom resulting from a failure of at least one of the first component or the second component of the first channel or the second channel, wherein steps a), b), and c) are performed on completion of detecting the symptom.

3. The method according to claim 2, wherein the symptom is at least one of a difference in a signature between the first channel and the second channel or a loss of communication between the calculator of the first channel and the calculator of the second channel.

4. The method according to claim 3, wherein, if the symptom is a difference in the signature between the first channel and the second channel, then detecting the symptom is performed in a previous execution cycle that precedes the current execution cycle.

5. The method according to claim 3, wherein the difference in the signature comprises comparing, at an end of the current execution cycle and in parallel on the first channel and the second channel, a sum of the successively executed calculations of the application task performed during the current execution cycle.

6. The method according to claim 3, wherein, if the symptom is a loss of communication between the calculator of the first channel and the calculator of the second channel, then detecting the symptom is performed during the current execution cycle.

7. The method according to claim 1, wherein instructions for the execution of the operational state test are sent by the application task.

8. The method according to claim 1, wherein the first component comprises a reprogrammable integrated circuit or FPGA.

9. The method according to claim 1, wherein the second component comprises a dynamic RAM.

10. A method for supervising an engine control unit of a turbomachine with at least a first channel and a second channel, the method comprising the following steps during a current execution cycle of an application task carried out by each of the first channel and the second channel:
   a) detecting a latency period during which the application task is waiting for data to perform calculations;
   b) performing, during the latency period, an operational state test of at least one component of the first channel and the second channel; and
   c) determining a state of said at least one component, wherein the state corresponds to a failure state or a healthy state.

* * * * *